United States Patent
Gibart

(10) Patent No.: US 7,076,715 B2
(45) Date of Patent: Jul. 11, 2006

(54) SAFETY NETWORK USING PHANTOM ADDRESS INFORMATION

(75) Inventor: Anthony Gerard Gibart, New Berlin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 505 days.

(21) Appl. No.: 10/357,168

(22) Filed: Jan. 31, 2003

(65) Prior Publication Data

US 2004/0153907 A1 Aug. 5, 2004

(51) Int. Cl.
*G06F 11/00* (2006.01)
(52) U.S. Cl. .................................... 714/746
(58) Field of Classification Search ................ 714/746, 714/748, 749, 751, 755, 758
See application file for complete search history.

(56) References Cited

U.S. PATENT DOCUMENTS

| | | | | |
|---|---|---|---|---|
| 4,932,023 A | * | 6/1990 | Geyer et al. ................ | 370/456 |
| 6,598,454 B1 | * | 7/2003 | Brazier et al. ............... | 73/1.71 |
| 2003/0134591 A1 | * | 7/2003 | Roberts et al. ............. | 455/3.06 |
| 2003/0147168 A1 | * | 8/2003 | Galbraith et al. ............. | 360/53 |

OTHER PUBLICATIONS

IBM International Technical Support Organization: "TCP/IP Tutorial and Technical Overview", (IBM Redbooks) 7th Edition, Aug. 2001, Chapter 21.2.4.

* cited by examiner

*Primary Examiner*—Guy Lamarre
*Assistant Examiner*—James C. Kerveros
(74) *Attorney, Agent, or Firm*—Quarles & Brady, LLP; R. Scott Speroff

(57) ABSTRACT

Messages in a high reliability industrial control system are associated with safety addresses preventing errors caused by misdirected messages. The safety address, however, is not transmitted with the message, but instead only the data of the message and an error detecting code based on a combination of the data and the safety address is sent. At a receiving node, an expected safety address is concatenated to the data of the message and the transmitted error correcting code compared against this combination to confirm proper addressing of the message. Network capacity is thus improved.

19 Claims, 1 Drawing Sheet

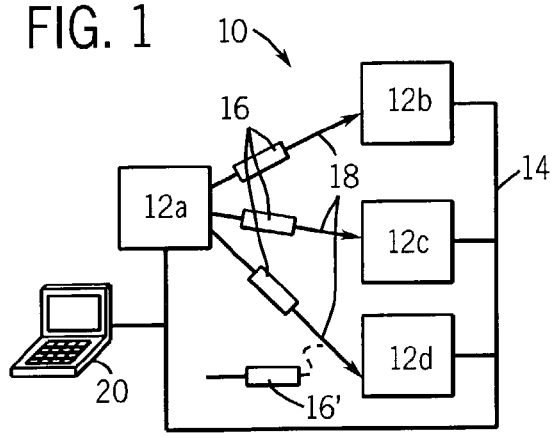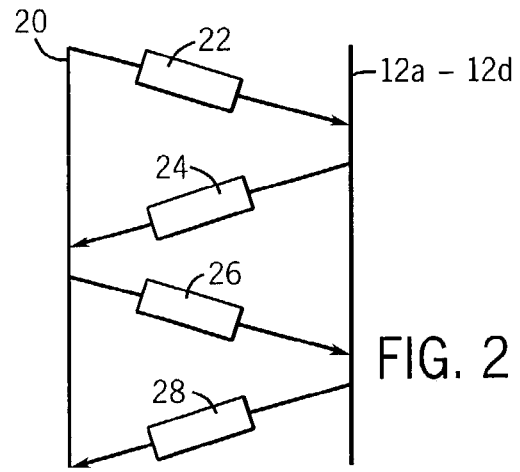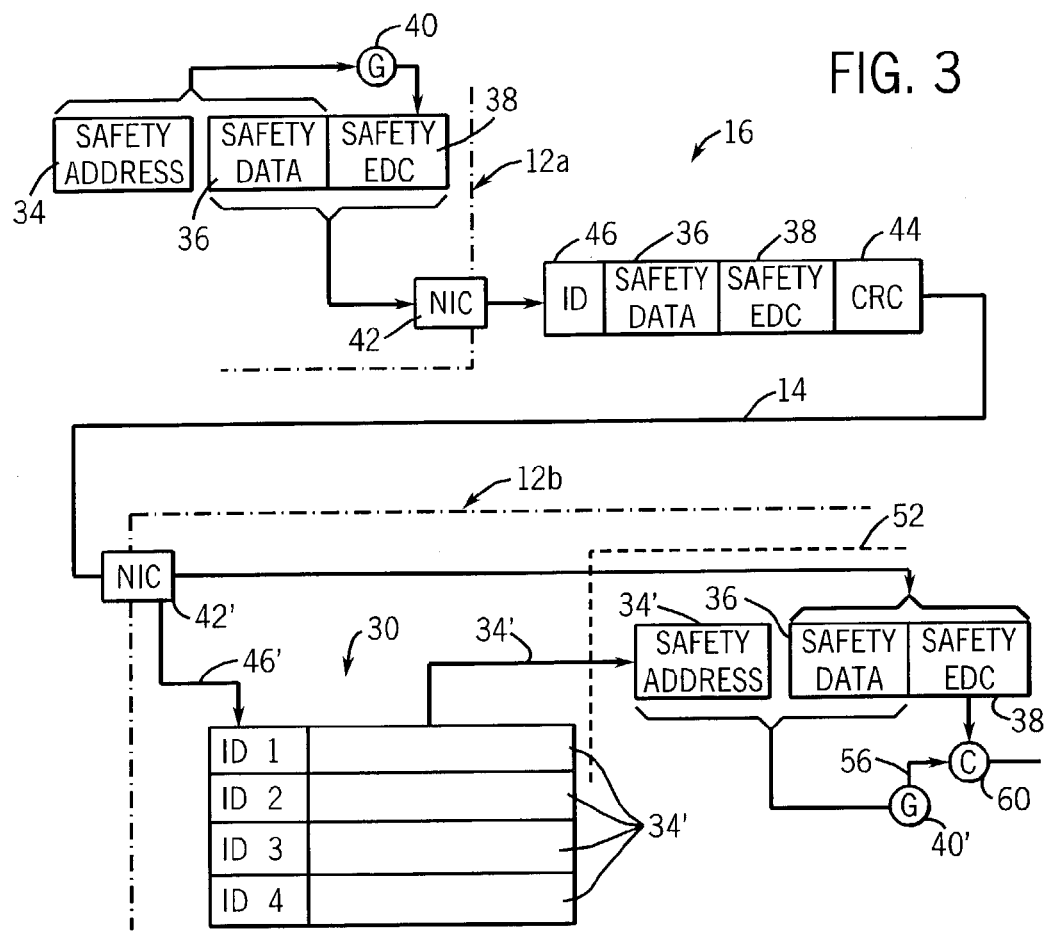

SAFETY NETWORK USING PHANTOM ADDRESS INFORMATION

BACKGROUND OF THE INVENTION

The present invention relates to industrial controllers used for real time control of industrial processes, and in particular, to a high reliability industrial controller appropriate for use in devices intended to protect human health and life.

Industrial controllers are special purpose computers used in controlling industrial processes. Under the direction of a stored control program, an industrial controller examines a series of inputs reflecting the status of the controlled process and changes a series of outputs controlling the process. The inputs and outputs may be binary, that is, on or off, or analog, providing a value within a continuous range. The inputs may be obtained from sensors attached to the controlled process and the outputs may be signals to actuators on the controlled process.

"Safety systems" are systems intended to ensure the safety of humans working in the environment of an industrial process. Such systems may include, but are not limited to, the electronics associated with emergency stop buttons, interlock switches, and machine lockouts.

Safety systems were originally implemented by hardwired safety relays, but may now be constructed using a special class of high reliability industrial controllers. "High reliability" refers generally to systems that guard against the propagation of erroneous data or signals to a predetermined high level of probability defined by safety certification standards. Such high reliability is obtained by detecting error or fault conditions and entering into a predetermined fault state. High reliability systems may be distinguished from high availability systems, however, the present invention may be useful in both situations, and therefore as used herein, high reliability should not be considered to exclude high availability systems.

A high reliability industrial controller may connect separated components of the controller with a high-speed serial network. In this case, the networks must also provide high reliability and, in particular, must have provisions for detecting both errors in network messages (for example, caused by electrical interference) and error in the destination of the messages (for example, correct messages delivered to the wrong device).

This latter problem of misdirected messages may be addressed by providing each communicating pair of devices with a unique safety address. U.S. patent application Ser. No. 09/667,145 filed Sep. 21, 2000, assigned to the assignee of the present invention and hereby incorporated by reference, describes a system where each message contains a unique "safety address". During an initialization of the network, each device is provided with a list of "legal" safety addresses of the messages the device should receive. Later, when a particular message is received by the device, the safety address of the message is compared with the stored legal safety addresses. If there is no match, it is assumed that the given message has been misdirected.

Adding a safety address to each message increases the message length and thereby reduces the capacity of the network. This reduced capacity may adversely affect the response time for the industrial controller and/or limit additional reliability enhancing features that might be added to the message to otherwise improve its reliability.

An alternative would be to use specialized hardware and firmware between the transmitter and the receiver that is inherently highly reliable without the need for a safety address. Such specialized hardware and firmware may be costly and cannot take advantage of existing network infrastructure.

SUMMARY OF THE INVENTION

The present invention provides the benefit of a safety address without adding to the message length or requiring specialized hardware and firmware between the transmitter and the receiver. This is accomplished by the use of a "phantom" safety address that may be deduced from the message but that is not contained in the message.

More specifically, each device on the network is pre-configured to know legal safety addresses for messages the device will transmit or receive. Prior to transmission of a message on the network, the safety address and the data for the message are combined and an error detection code covering both is calculated. The safety address is then removed from the message and only the data and the error detection code are sent. When the message is received, the receiving node adds an expected safety address to the received data and compares the received error detection code with that combination of expected safety address and data. A mismatch indicates a misdirected message without the actual safety address being transmitted.

Specifically, the present invention provides a method of producing a high reliability network joining communicating nodes. Each node is provided with an expected safety address for messages it should receive. At transmitting nodes, an error detecting code covering a combination of data to be transmitted and a safety address is calculated and a message containing the data and error detecting code without the safety address is sent. At a receiving node, the error detecting code of the message is compared against a test error detecting code calculated from the combination of the data of the message. If the test error detecting code does not match the error detection code of the message, it is assumed that the message has been misdirected.

Thus, it is one object of the invention to provide a method of detecting misdirected messages that does not require transmission of lengthy address information.

The method may use a standard serial network that also attaches an address to the message.

Thus, it is another object of the invention to provide a technique that may work in tandem with standard network protocols and does not require modification of those network protocols. In this way, pre-existing network hardware may be used. Generally, the steps of the present invention may be performed by software that modifies data before it is transmitted on the network by standard network interface circuits.

Each node may be provided with multiple expected safety addresses, for example, for different network connections, and may select among the expected safety addresses based on the address added by the standard network protocol, or by an index number contained in the data of the message.

Thus, it is another object of the invention to allow the present device to identify misdirected messages not only between different nodes but also between different connections between the same nodes.

The safety address may be an address of the receiving node, the transmitting node, or a connection therebetween.

Thus, it is another object of the invention to provide flexibility in selection of the type of safety address.

Upon detection of a misdirected message, the network may enter a safety state.

Thus, it is another object of the invention to use the detection of misdirected messages to meet safety system requirements.

These particular objects and advantages may apply to only some embodiments falling within the claims and thus do not define the scope of the invention.

BRIEF DESCRIPTION OF THE DRAWINGS

FIG. 1 is a simplified schematic of a network physically connecting nodes of an industrial controller showing messages transmitted from one node to others;

FIG. 2 is a chart showing the path of message flow between a configuration tool and a network as a function of time, the messages used to configure the network according to the present invention; and FIG. 3 is a flow diagram showing the transmission of a message from a transmitting node to a receiving node, after the configuration of FIG. 2, using the present invention.

DETAILED DESCRIPTION OF THE PREFERRED INVENTION

The present invention can be part of a "safety system" used to protect human life and limb in the industrial environment. Nevertheless, the term "safety" as used herein is not a representation that the present invention will make an industrial process safe or that other systems will produce unsafe operation. Safety in an industrial process depends on a wide variety of factors outside the scope of the present invention, including: design of the safety system, installation, and maintenance of the components of the safety system, and cooperation and training of individuals using the safety system. Although the present invention is intended to be highly reliable, all physical systems are susceptible to failure and provision must be made for such failure.

Referring now to FIG. 1, a high reliability industrial control system 10 for implementing a safety system may include a number of intercommunicating nodes 12a–12d, exchanging messages 16 on a high speed serial network 14. The network 14 may be, for example, one or more standard networks such as Ethernet, DeviceNet, ControlNet, FireWire, or FieldBus. The network 14 may use a single or multiple conductor copper media or may use fiber optics, wireless communication technology, or other well-known alternatives. Such networks 14 allow one or more physical media to interconnect each of the nodes 12 with the messages directed by addresses contained in the messages. Network 14 may be an external network, an internal backplane, or the like.

Making use of the protocol of the network 14, a master node 12a may establish logical connections 18 with other nodes 12b–12d to direct messages 16 to particular ones of the other nodes 12b–12d. The nodes 12 may be, for example, components of the high reliability industrial control system 10 including input or output circuits and a centralized controller. Generally, each of the nodes 12 includes a processor for executing a safety protocol program of the present invention and a standard network interface circuit (NIC) used to provide a low level interface between the node 12 and the network 14.

Errors may occur in such networks 14 in which a particular message 16' becomes misdirected, for example, in which a message 16' is received by a node 12d, for which it was not intended. Such misdirection may occur for a number of reasons including alterations in the bit pattern that provide the implicit address of the message 16' as may be caused by external electromagnetic interference. Such misdirected messages 16' may otherwise exhibit no detectable error and, if acted upon, can undermine the reliability of the system.

Referring to FIGS. 1 and 2, in the present invention, a configuration procedure is adopted prior to use of the network 14 so as to provide each node (transmitting and receiving) with a pre-stored unique safety address for each message 16 allowing misdirected messages 16' to be detected. In the configuration process, a configuration terminal 20 attached to the network 14 sends a configuration message 22 to each of the nodes 12a through 12d. The configuration message 22 includes configuration data as will be described below and a safety configuration consistency value (SCCV) reflecting physical characteristics of a particular node 12 in a way likely to be unique. In the preferred embodiment, the SCCV value is a concatenation of a product vendor identification number, a device-type number, a product code number, and a serial number together with error detecting code. The error detecting code may be, for example, a cyclic redundancy code (CRC) well known in the art, and used for most serial network protocols.

Each of these numbers is unique to the particular node 12 and normally readable by the hardware of the node 12. The SCCV values are collected as the network 14 is assembled and stored in the configuration terminal 20.

When the configuration message 22 is received by the node 12a–12d, the node recalculates its own SCCV value and compares it to the SCCV value of the configuration message 22. If there is a match, this recalculated SCCV is returned to the configuration terminal 20 as configuration acknowledgement message 24. If the SCCV values for configuration message 22 and configuration acknowledgement message 24 match, then the configuration is successful and configuration terminal 20 sends out an application message 26 indicating that the configuration should be applied. This provokes from node 12a–12d, an application acknowledgment message 28. If the acknowledgment signal is not received within a predetermined time interval, the pending configuration will be cleared by an additional message from the configuration terminal 20. Configuration must be successfully completed before the network 14 can be used for the high reliability industrial control system 10. This process ensures that there is a one-to-one mapping between logical and physical devices.

Upon completion of the configuration process, a number of logical connections may be opened between the nodes 12a–12d. Alternatively, the configuration may occur at the time of the establishment of the standard network connections between the nodes 12a–12d. In this case, the configuration message 22 also contains information necessary to establish the network connection including, for example, the size of the intended message on the connection, and a predetermined periodic rate at which messages on the connection are expected.

Upon-configuration of the network 14 and the opening of connections between the nodes 12, each of the connections between nodes 12 is assigned a unique safety address. The safety address may, for example, be formed of a unique number associated with the transmitting node 12 and a connection number unique to the transmitting node 12. When combined, these numbers produce a safety address unique within the high reliability industrial control system 10. Alternatively, the safety address may be the address of the receiving node 12 combined with a connection serial number or any other unique combination. Referring to FIG. 3, multiple safety addresses 34' may be stored in each receiving node 12 in a legal safety address table 30.

Referring now to FIGS. 1 and 3, during operation of the high reliability industrial control system 10, safety data 36 will be transmitted from a transmitting node 12a to a receiving node 12b in a message 16. Each message 16 is associated with a particular logical connection 18 (shown in FIG. 1) being established between nodes 12 and 12' as described above.

At the transmitting node 12a, the safety address 34 or the particular connection 18 is identified. The safety address 34 is concatenated to the safety data 36 and a safety error detecting code 38 is calculated on the combination. The safety error detecting code 38 is produced by generator 40 which may be implemented in hardware or software.

Generally, the error detecting code (EDC) 38 is a number sequence, for example, a cyclic redundancy code (CRC) or other compressed representation of the argument received by the generator 40. The safety error detecting code 38 provides a compressed representation of the combined safety address 34 and safety data 36 and is normally used, and may be used in this case, so that at a later time the safety error detecting code 38 may be compared to the combined safety address 34 and safety data 36 to detect, and in some cases, correct errors in the combined safety address 34 and safety data 36. These errors may be caused by electrical interference with the signals on the network 14 such as may switch a binary representation of a "one" to a "zero" or vice versa.

As will be seen, however, the safety error detecting code 38 also provides an effective transmission of information about the safety address 34 that allows the safety address 34 not to be sent on the network 14. Accordingly, the safety address 34 stripped away from the safety data 36 and safety error detecting code 38 at the transmitting node 12a, and only the safety data 36 and safety error detecting code 38 are provided to the network interface circuit (NIC) 42 of the transmitting node 12a.

The NIC 42 further modifies the safety data 36 and safety error detecting code 38 according to the particular requirements of the protocol of the network 14. While such network protocols differ, generally the NIC 42 will add an additional network error detecting code, i.e., cyclic redundancy code (CRC) 44 having as its argument the safety data 36 and safety error detecting code 38 to the safety message 16. The NIC 42 may also add a connection identifier 46 providing a low level address for the safety message 16 under the protocol of the network 14.

Upon receipt of safety message 16 by network interface circuit (NIC) 42', the CRC 44 is compared with the argument from the safety message 16 and if there is a match, the safety data 36 and safety error detecting code 38 are forwarded to the buffer 52 provided by hardware or the safety protocol program operating in software. The connection identifier 46' can be made available to the safety protocol program by any of a number of mechanisms and is used by the safety protocol program as an index for the legal safety address table 30 to thereby identify an expected safety address 34' for the received safety message 16.

The expected safety address 34' is concatenated to the safety data 36 and forwarded to a generator 40' which produces an expected safety error detecting code 56 which is compared with the actual safety error detecting code 38 by comparator 60. If there is a match, the safety data 36 is forwarded to the control program. If there is no match, the high reliability industrial control system 10 may enter a safety state which generally provides a shutting down of portions or all of the high reliability industrial control system 10 according to the predefined safety states for its inputs and output.

Thus, it will be understood that the benefits of having a safety address or addresses in each message may be obtained without actual transmission of the safety address itself The safety error detecting code 38 effectively provides for a compressed representation of the information in the safety address 34. The degree of compression may be adjusted to provide the necessary degree of reliability.

It is specifically intended that the present invention not be limited to the embodiments and illustrations contained herein, but include modified forms of those embodiments including portions of the embodiments and combinations of elements of different embodiments as come within the scope of the following claims. For example, the function of the safety error correcting code could be broken into several error correcting codes and a variety of different error correcting code compression systems may be used.

I claim:

1. A method of joining communication nodes in a high reliability network joining communicating nodes, the method comprising the steps of:
   (a) providing each node with an expected safety address for expected messages;
   (b) at a node transmitting a message on the network, calculating an error detecting code covering a combination of data to be transmitted by the node and a safety address, and transmitting the data and error detecting code as the message on the network without the safety address; and
   (c) at a node receiving the message from the network, evaluating a match between the error detecting code of the message and a combination of the data of the message and the expected safety address to detect a misdirected message.

2. The method of claim 1 including the steps of formatting the message for transmission and receipt on a standard serial network, the formatting attaching a second address to the message associated with the standard serial network.

3. The method of claim 2 wherein step (a) provides each node with multiple expected safety addresses and wherein the node receiving the message selects an expected safety address from among a set of expected safety addresses based on the second address.

4. The method of claim 2 wherein the standard serial network provides communications over a number of logical connections and wherein the second address is a unique number, a connection over which the message is received.

5. The method of claim 1 where the safety address identifies the node receiving the message.

6. The method of claim 1 wherein the safety address identifies the node transmitting the message.

7. The method of claim 1 wherein the network is a standard serial network providing communications over a number of logical connections and the safety address identifies a connection.

8. The method of claim 1 wherein the network is selected from the group consisting of: Ethernet, DeviceNet, ControlNet, FireWire or FieldBus.

9. The method of claim 1 wherein upon detection of a misdirected message at step (c) the network enters a safety state.

10. A device for receiving messages on a high reliability network, the device comprising:

a network interface connected to the network to receive messages therefrom, the messages including an error detecting code and a high reliability data portion;

storage means for holding an expected safety address for a message; and means communicating with the network interface and storage means for comparing the error detecting code of a received message to a computed error correcting code derived from a combination of the high reliability data portion of the message and the expected safety address, to detect misdirected messages, whereby misaddressed messages are detectable without receipt of a safety address with the message.

11. The device recited in claim 10 wherein the network interface provides communication with a standard serial network selected from the group consisting of: Ethernet, DeviceNet, ControlNet, FireWire or FieldBus.

12. The device recited in claim 10 wherein the network interface includes error detection circuitry operating on a second error detection code attached to the messages received on the network.

13. The device recited in claim 10 wherein the storage means holds multiple expected safety addresses and further including a selection means selecting one of the multiple expected safety addresses for comparing the error detecting code.

14. The method of claim 10 including means for entering a safety state upon detection of a misdirected message.

15. A device for transmitting messages on a high reliability network, the messages including an error detecting code and high reliability data, the device comprising:

storage means holding a safety address for a message;

means for generating the error detecting code from a combination of high reliability data and the safety address;

a network interface transmitting the message on the network including the error detecting code and a high reliability data without the safety address;

whereby misaddressed messages are identifiable without transmission of the safety address with the message.

16. The device recited in claim 15 wherein the network interface provides communication with a standard serial network selected from the group consisting of Ethernet, DeviceNet, ControlNet, FireWire, or FieldBus.

17. The device recited in claim 15 wherein the network interface includes error detection circuitry attaching a second error detection code to the message transmitted on the network.

18. The device recited in claim 15 wherein the storage means holds multiple safety addresses and further including a selection means selecting one of the multiple safety addresses depending on the destination of the message.

19. The method of claim 15 including an associated receiver having means for detecting a misdirected message at by the receiver to break the connection to the transmitter causing the transmitter to go to into a safety state.

* * * * *